United States Patent
Pütz et al.

(10) Patent No.: US 10,173,626 B2
(45) Date of Patent: Jan. 8, 2019

(54) CAPACITIVE VEHICLE SEAT OCCUPANCY DETECTION SYSTEM WITH DETECTION OF VEHICLE SEAT HEATER MEMBER INTERRUPTION

(71) Applicant: IEE INTERNATIONAL ELECTRONICS & ENGINEERING S.A., Echternach (LU)

(72) Inventors: Michael Pütz, Trier (DE); Oliver Lion, Merzig (DE)

(73) Assignee: IEE International Electronics & Engineering S.A., Echternach (LU)

( * ) Notice: Subject to any disclaimer, the term of this patent is extended or adjusted under 35 U.S.C. 154(b) by 99 days.

(21) Appl. No.: 15/515,527

(22) PCT Filed: Sep. 30, 2015

(86) PCT No.: PCT/EP2015/072597
§ 371 (c)(1),
(2) Date: Mar. 29, 2017

(87) PCT Pub. No.: WO2016/050864
PCT Pub. Date: Apr. 7, 2016

(65) Prior Publication Data
US 2017/0247004 A1    Aug. 31, 2017

(30) Foreign Application Priority Data
Sep. 30, 2014 (LU) .......................................... 92563

(51) Int. Cl.
*B60R 21/015* (2006.01)
*A47C 7/74* (2006.01)
*G01R 31/00* (2006.01)
*B60N 2/56* (2006.01)
(Continued)

(52) U.S. Cl.
CPC .......... *B60R 21/0154* (2014.10); *A47C 7/748* (2013.01); *B60N 2/002* (2013.01);
(Continued)

(58) Field of Classification Search
CPC .......... B60R 21/01524; B60R 21/0153; B60R 2021/01286; B60R 21/01532;
(Continued)

(56) References Cited

U.S. PATENT DOCUMENTS 6,759,851 B2    7/2004    Hazelton
6,960,918 B2    11/2005   Hazelton
9,764,669 B2 *  9/2017    Lamesch ................ B60N 2/002

FOREIGN PATENT DOCUMENTS

DE    4110702 A1    10/1992
EP    2325060 A2    5/2011
(Continued)

OTHER PUBLICATIONS

International Search Report for International application No. PCT/EP2015/072597, dated Dec. 18, 2015, 4 pages.
(Continued)

*Primary Examiner* — Jermele M Hollington
*Assistant Examiner* — Zannatul Ferdous
(74) *Attorney, Agent, or Firm* — Reising Ethington P.C.

(57) ABSTRACT

A capacitive detection system for detecting occupancy of a vehicle seat includes a signal generating unit and a signal evaluation unit. The vehicle seat has a seat heater member configured for receiving time-varying output signals of the signal generating unit. The signal evaluation unit is configured to generate an output signal that is indicative of the seat heater member to be defective, if the sensed capacitance of the seat heater member is less than a second predetermined threshold value for the sensed capacitance.

13 Claims, 3 Drawing Sheets

(51) Int. Cl.
*B60N 2/00* (2006.01)
*G01R 19/165* (2006.01)
*G01R 31/02* (2006.01)
*B60N 2/02* (2006.01)

(52) U.S. Cl.
CPC ...... *B60N 2/5685* (2013.01); *B60R 21/01532* (2014.10); *G01R 19/16528* (2013.01); *G01R 31/006* (2013.01); *G01R 31/024* (2013.01); *B60N 2002/0272* (2013.01)

(58) Field of Classification Search
CPC ...... G01R 31/001; G01R 29/26; B60N 2/002; B60N 2/56; G01G 19/4142
USPC .................................................. 340/438, 667
See application file for complete search history.

(56) References Cited

FOREIGN PATENT DOCUMENTS

| | | |
|---|---|---|
| JP | 2013163413 | 8/2013 |
| WO | WO2011117237 A1 | 9/2011 |
| WO | WO2012093080 A1 | 7/2012 |
| WO | WO2012113833 A1 | 8/2012 |
| WO | WO2014122197 A1 | 8/2014 |

OTHER PUBLICATIONS

Written Opinion for International application No. PCT/EP2015/072597, dated Dec. 18, 2015, 5 pages.

* cited by examiner

CAPACITIVE VEHICLE SEAT OCCUPANCY DETECTION SYSTEM WITH DETECTION OF VEHICLE SEAT HEATER MEMBER INTERRUPTION

TECHNICAL FIELD

The invention relates to a capacitive vehicle seat occupancy detection system, a method for detecting a defective seat heater member of a vehicle seat with such capacitive detection system installed, and a software module for carrying out the method.

BACKGROUND ART

Vehicle seat occupancy detection systems are nowadays widely used in vehicles, in particular in passenger cars, for providing a seat occupancy signal for various appliances, for instance for the purpose of a seat belt reminder (SBR) system or an activation control for an auxiliary restraint system (ARS). Seat occupancy detection systems include seat occupancy sensors that are known to exist in a number of variants, in particular based on capacitive sensing. An output signal of the seat occupancy detection system is usually transferred to an electronic control unit of the vehicle to serve, for instance, as a basis for a decision to deploy an air bag system to the vehicle seat.

It is further known in the art to use a portion of an electric seat heater of a vehicle seat as a sensor in a capacitive seat occupancy detection system. For example, patent application publication DE 41 10 702 A1 describes a vehicle seat with an electric seat heater comprising a conductor which can be heated by the passage of electrical current through it. The conductor is located in the seating surface and forms a part of a capacitive sensor for detecting a seat occupancy of the seat.

In vehicle seats that are equipped with one or more seat heater members, it is known to be beneficial to incorporate at least one seat heater member in a capacitive measurement of a vehicle seat occupancy detection system, due to an inherent strong capacitive coupling to a seat frame of the vehicle seat and the benefit of hardware savings.

In such vehicle seats there exists a risk of compromising the reliability of the seat occupancy detection system by a failure of the seat heater member that is involved in the capacitive measurement. Therefore, detection of a seat heater member failure is desirable.

It is therefore an object of the invention to provide a capacitive vehicle seat occupancy detection system with an improved capability of detecting failures of a seat heater member that is involved in the capacitive measurement of the vehicle seat occupancy detection system.

SUMMARY

In one aspect of the present invention, the object may be achieved by a combined seat heater and capacitive seat occupancy detection system for detecting an occupancy of a vehicle seat, wherein the seat heater comprises at least one seat heater member, and the capacitive detection system includes a signal generating unit provided for generating a time-varying output signal at an output port, wherein the time-varying output port is configured to be electrically connectable to the at least one seat heater member for providing the time-varying output signal, and a signal evaluation unit that is provided for sensing an electrical quantity that is indicative of a capacitance of the at least one seat heater member.

In at least some embodiments, the signal evaluation unit is further provided for generating an output signal that is representative of the sensed capacitance and that is usable as a basis for at least one out of detecting and classifying a seat occupancy by comparison to at least a first predetermined value for the sensed capacitance.

Then, the signal evaluation unit is configured to generate an output signal that is indicative of the at least one seat heater member to be defective, if the sensed capacitance of the at least one seat heater member is less than a second predetermined threshold value for the sensed capacitance.

It is noted herewith that the terms "first", "second", etc. are used for distinction purposes only and are not meant to indicate or anticipate a sequence or a priority in any way.

The term "electrically connectable", as used in this application, shall be understood to encompass galvanic electrical connections as well as connections established by capacitive and/or inductive electromagnetic coupling.

The term "sensed capacitance", as used in this application, shall be understood to encompass an absolute measurement of a capacitance value as well as a measurement of a capacitance value relative to an arbitrarily determined capacitance zero.

Preferably, the time-varying output signal is a periodic output signal. The periodic signal may be a sinusoidal signal or a square-wave signal. In one embodiment, the periodic output signal has a fundamental frequency selected from a range between 1 kHz and 5 MHz.

In this way, a reliable detection of a specific type of failure of a seat heater member that is involved in a capacitive measurement of the capacitive vehicle seat occupancy detection system can be accomplished. The specific type of failure may be a double breakage of the seat heater member itself or a double interruption of electrical connections conveying the time-varying output signal to the seat heater member. The insight of the invention is that this type of failure of the seat heater member that is involved in the capacitive measurement will lead to a decreased capacitance that can be sensed by the signal evaluation unit.

Preferably, the capacitance of the at least one seat heater member that is involved in the capacitive measurement is measured against a chassis of the vehicle seat.

The seat occupancy classification may comprise at least two classes selected out of a group formed by classes "empty", "child" and "adult".

In a preferred embodiment, the second predetermined threshold value is less than a capacitance of the at least one seat heater member for a condition of an unoccupied vehicle seat. By that, the above-described specific type of failure of a seat heater member that is involved in a capacitive measurement of the capacitive vehicle seat occupancy detection system can reliably and definitely be detected.

In another aspect of the invention, a vehicle seat is provided with an embodiment of the disclosed capacitive vehicle seat occupancy detection system being at least partially installed in the vehicle seat. The vehicle seat comprises a seat base that is configured for taking up a seat base cushion, wherein the seat base and the seat base cushion are provided for supporting a bottom of a seat occupant. The vehicle seat further includes a backrest that is configured for taking up a backrest cushion provided for supporting a lumbar and back region of the seat occupant. Then, the vehicle seat comprises at least one seat heater member that is at least partially disposed at at least one out of the seat base cushion and the backrest cushion and is electrically connected to the signal generating unit of the capacitive vehicle seat occupancy detection system. This enables a heatable vehicle seat with a capacitive seat occupancy detection system to be provided with a capability of detecting the above-described specific type of failure of a seat heater member that is involved in the capacitive measurement of the vehicle seat occupancy detection system.

In yet another aspect of the invention, a method is proposed for detecting a defective seat heater member of a vehicle seat having a capacitive vehicle seat occupancy detection system that is configured for detecting an occupancy of the vehicle seat. The vehicle seat comprises at least one seat heater member. The capacitive vehicle seat occupancy detection system includes a signal generating unit provided for generating a time-varying output signal and a signal evaluation unit that is provided for sensing an electrical quantity that is indicative of a capacitance.

The proposed method comprises steps of
applying a time-varying electrical signal at least to the at least one seat heater member by the signal generating unit,
sensing an electrical quantity that is indicative of a capacitance of the at least one seat heater member by the signal evaluation unit,
checking a first condition representing that the sensed capacitance of the at least one seat heater member is less than a second predetermined threshold value, and
generating an output signal that is indicative of the at least one seat heater member to be defective on the basis of at least the first condition to be fulfilled.

With this method, a reliable detection of the above-described specific type of failure of a seat heater member that is involved in a capacitive measurement of the capacitive vehicle seat occupancy detection system can be accomplished.

Preferably, the step of sensing a capacitance of the at least one seat heater member that is involved in the capacitive measurement is measured against the chassis of the vehicle seat.

In a preferred embodiment, the method includes a step of using a capacitance value of the at least one seat heater member in a condition of the vehicle seat being unoccupied as the second predetermined threshold value. This enables a reliable and definite detection of the above-described specific type of failure of a seat heater member that is involved in a capacitive measurement.

In one embodiment, the method comprises a preceding step of determining the capacitance value of the at least one seat heater member in the condition of the vehicle seat being unoccupied for calibration purposes. By that, the second predetermined threshold value can be based on an individually determined value that considers deviations from a nominal arrangement of the at least one seat heater member within the vehicle seat.

If the step of generating an output signal that is indicative of the at least one seat heater member to be defective is carried out on the basis of the first condition to be fulfilled and at least one additional condition to be fulfilled that is indicative of the vehicle seat being unoccupied,
it can be confirmed that the capacitive measurement is performed indeed under the condition of the vehicle seat being unoccupied, which enlarges the reliability in case of a detected defective seat heater member, and
an availability of opportunities for performing the detection method, and thus safety, can be increased, as these opportunities are regularly reduced during a vehicle state of ignition-on as most properly the vehicle seat is occupied then.

Preferably, the at least one additional condition to be fulfilled is selected from a group of conditions consisting of
a second condition of the seat buckle state indicator indicating an unbuckled state, provided that the vehicle includes a seat buckle state indicator, and the method comprises a step of checking a fulfillment of the second condition, and
a third condition of the vehicle speed indicator indicating a vehicle speed of zero, provided that the vehicle includes a vehicle speed indicator, and the method comprises a step of checking a fulfillment of the third condition, and
a fourth condition of the ignition state indicator indicating an ignition state being off, provided that the vehicle includes an ignition state indicator, and the method comprises a step of checking a fulfillment of the fourth condition, and
a fifth condition of the keyless entry state indicator indicating a keyless entry state being an absent key, provided that the vehicle includes a keyless entry state indicator, and the method comprises a step of checking a fulfillment of the fifth condition, and
a sixth condition of the central locking state indicator indicating a central locking state being a locked state, provided that the vehicle includes a central locking state indicator, and the method comprises a step of checking a fulfillment of the sixth condition.

In one embodiment, the method comprises
a step of starting a predetermined time period if one out of the first condition, the second condition, the third condition, the fourth condition, the fifth condition and the sixth condition are fulfilled, and
a step of checking a seventh condition of the predetermined time period having elapsed, wherein
the step of generating an output signal that is indicative of the at least one seat heater member to be defective is carried out on the basis of the seventh condition and at least one out of the second condition, the third condition, the fourth condition, the fifth condition and the sixth condition to be fulfilled.

In this way, a false generation of an output signal, for instance due to electromagnetic interference, that is indicative of the at least one seat heater member to be defective can be avoided and the reliability of a result of the step of checking can be improved.

These and other aspects of the invention will be apparent from and elucidated with reference to the embodiments described hereinafter.

BRIEF DESCRIPTION OF THE DRAWINGS

Preferred embodiments of the invention will now be described, by way of example, with reference to the accompanying drawings, in which.

DESCRIPTION OF PREFERRED EMBODIMENTS

Figure 1:
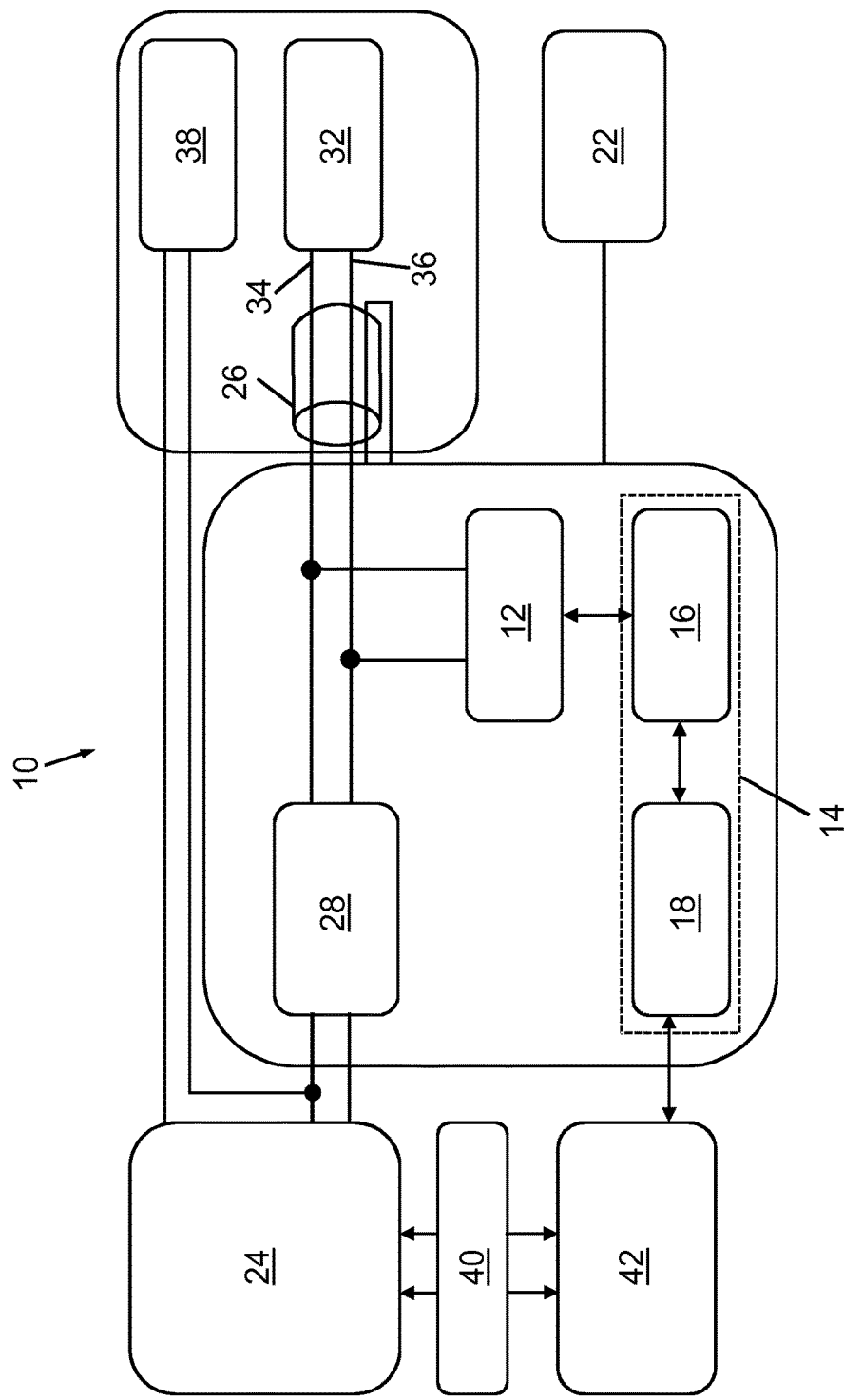
FIG. 1 schematically illustrates a configuration of an embodiment of a capacitive vehicle seat occupancy detection system in accordance with the invention as being partially installed in a vehicle seat of a passenger car.

FIG. 1 schematically illustrates a configuration of an embodiment of a combined seat heater and capacitive vehicle seat occupancy detection system 10 in accordance with the invention to be installed in a vehicle seat e.g. of a passenger car.

The vehicle seat includes a seat base 22, i.e. a seat frame or seat pan, configured for taking up a seat base cushion, the seat base and the seat base cushion being provided for supporting a bottom of a seat occupant. The vehicle seat further comprises a backrest configured for taking up a backrest cushion provided for supporting a lumbar and back region of the seat occupant. Seats of this kind are well known in the art and shall therefore neither shown in a figure nor be described in further detail herein.

The vehicle seat may comprise a plurality of seat heater members, each of which comprises e.g. a piece of electric wire made from a copper-nickel alloy with low temperature coefficient, such as Constantan®, and having an outer electrical insulation layer. The seat heater members are arranged in a meandering manner at various locations of the vehicle seat, as is known in the art. One seat heater member 32 is attached to a seat base cushion front member, and two more seat heater members are attached to a two-part seat base cushion center member, close to the A surface of the seat base cushion. The meandering patterns formed by the seat heater members cover a major portion of the surface of the seat base cushion center member.

The vehicle further comprises a seat heater control unit 24 that is connected to a battery 40 of the vehicle. The seat heater control unit 24 is configured to provide pulse-width modulated electric power of variable duty cycle to the seat heater members 32. To this end, electrical connection ends 34, 36 of each one of the plurality of seat heater members are electrically connected to the seat heater control unit 24 by shielded cables 26 and via common mode chokes 28 for decoupling purposes (exemplarily shown for seat heater member 32 in FIG. 1). The seat heater control unit 24 includes a temperature sensor 38 that is disposed at an appropriate position in the vehicle seat 22 and that is configured for providing signals indicative of a temperature of the vehicle seat 22 to the seat heater control unit 24 for control purposes.

Moreover, the capacitive vehicle seat occupancy detection system 10 includes a signal generating unit 12 and a signal evaluation unit 14, which are installed remotely from the vehicle seat.

The signal generating unit 12 is provided for generating a square-wave or sine-wave output signal and for applying the output signal to seat heat member 32. In this specific embodiment, the time-varying output signal is designed as a square-wave signal with a fundamental frequency of 30 kHz, but other signal forms and/or frequencies are also contemplated that appear to be suitable to the person skilled in the art. The electrical connection ends 34, 36 of the seat heater member 32 that is attached to the seat base cushion front member are also connected to the signal generating unit 12 to enable applying the time-varying output signal.

The electrical connection ends 34, 36 of the seat heater member 32 that is attached to the seat base cushion front member are connected to the signal generating unit 12 which, in turn, is connected to the signal evaluation unit 14. The signal evaluation unit 14 comprises a micro-controller 16 and is provided for sensing an electrical quantity that is indicative of a capacitance of the seat heater member 32 that is connected to the signal generating unit 12.

The signal evaluation unit 14 is further provided for generating an output signal that is representative of the sensed capacitance and that is usable as a basis for detecting and classifying a seat occupancy by comparison to predetermined values for a sensed capacitance. In this specific embodiment, the signal evaluation unit 14 is configured to generate output signals representing seat occupancy classes "child/unoccupied seat" (class 1) and "adult" (class 2). In other embodiments, different seat occupancy classes may be chosen that appear to be suitable to the person skilled in the art.

The signal evaluation unit 14 is furthermore configured to generate an output signal that is indicative of the seat heater member 32 that is connected to the signal generating unit 12 to be defective, if the sensed capacitance of the seat heater member 32 that is connected to the signal generating unit 12 is less than a second predetermined threshold value for the sensed capacitance.

The signal evaluation unit 14 is equipped with a communication interface 18 that is connected to an airbag control unit 42 of the vehicle, and is configured for transferring output signals to the airbag control unit 42 for the purpose of air bag activation control. For instance, if the transferred output signal represents the occupancy class "adult", an airbag of the vehicle seat will be deployed.

Figure 2:
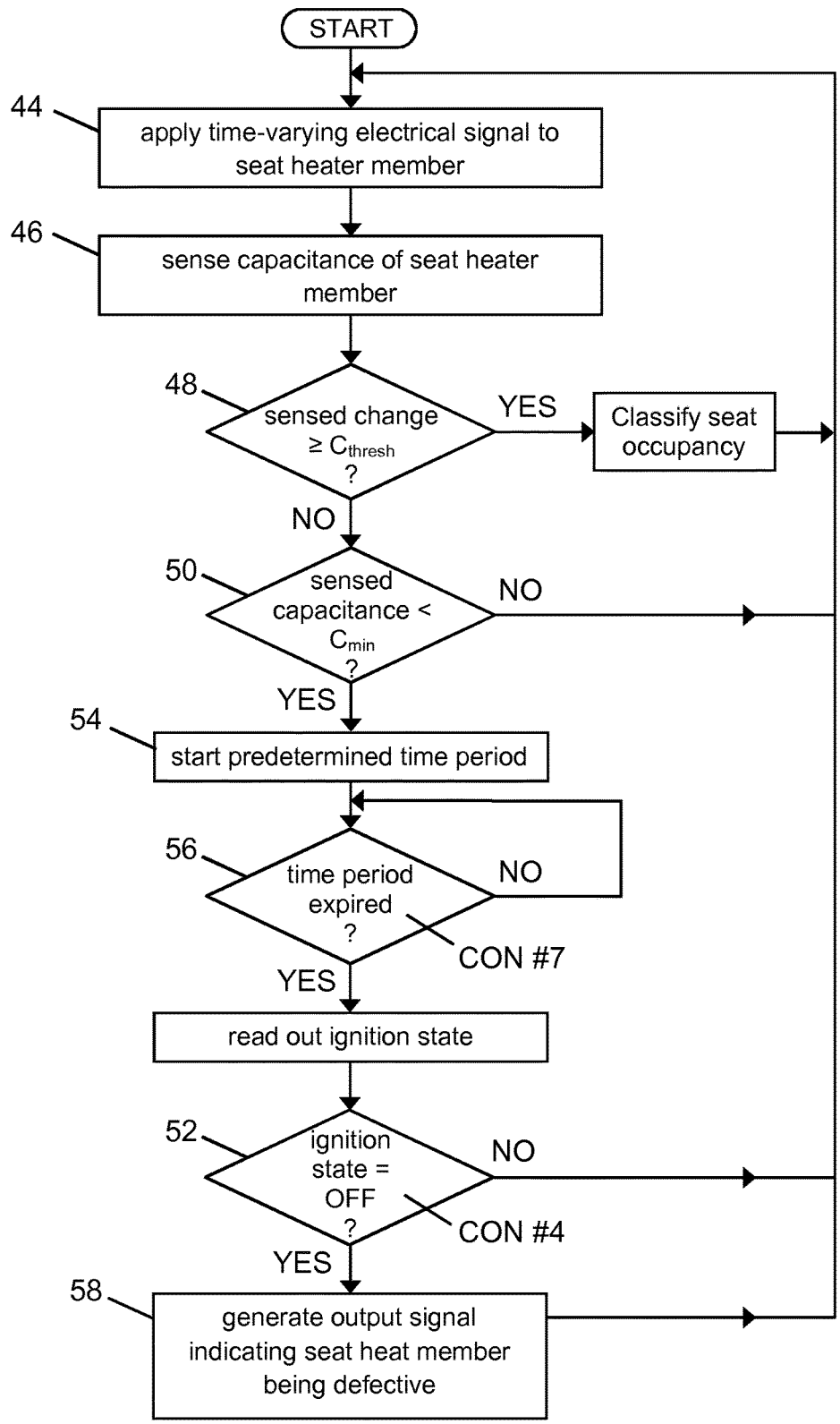
FIG. 2 shows a flow chart of an embodiment of the method in accordance with the invention.

In the following, an embodiment of the method for detecting a defective seat heater member 32 of the vehicle seat 22 is described. A flow chart of the method is given in FIG. 2. In preparation of operating the capacitive vehicle seat occupancy detection system 10, it shall be understood that all involved units, devices and systems are in an operational state and configured as illustrated in FIG. 1.

In order to be able to carry out the method, the signal evaluation unit 14 comprises a software module. The method steps to be conducted are converted into a program code of the software module. The program code is implemented in a digital data memory unit of the signal evaluation unit 14 and is executable by a processor unit of the signal evaluation unit 14. The digital data memory unit and the processor unit are components of the micro-controller 16. Alternatively, the software module may as well reside in and may be executable by a control unit of the vehicle, for instance by the airbag control unit 42, and established data communication means 18 between the signal evaluation unit 14 and the airbag control unit 42 of the vehicle would be used for enabling mutual transfer of data.

In a preparatory and preceding step of the method, a capacitance value of the seat heater member 32 is determined in the condition of the unoccupied vehicle seat 22 for calibration purposes, followed by a step of using the determined capacitance value of the seat heater member 32 for a condition of the vehicle seat 22 being unoccupied as a second predetermined threshold value.

In a first step 44 of the method (FIG. 2), a time-varying electrical signal is applied to the seat heater member 32 by the signal generating unit 12. In a next step 46, the signal evaluation unit 14 senses an electrical quantity that is indicative of a capacitance of the seat heater member 32. Next, a condition representing that the sensed capacitance of the seat heater member 32 is larger than a first predetermined threshold value $C_{thresh}$ is checked in a step 48. If so, the seat occupancy is classified. If not, a condition representing that the sensed capacitance of the seat heater member 32 is less than the second predetermined threshold value $C_{min}$ is checked in another step 50. In case of a negative result of the step 50 of checking, the preceding steps (except for the preliminary steps) are automatically repeated.

In case of a positive result of the step 50 of checking, a step 54 of starting a predetermined time period is conducted, and steps 56 of checking a condition CON #7 of the predetermined time period having elapsed are periodically being carried out until the result of the step 56 of checking is positive.

In case of a positive result of the step 56 of checking, a step 52 of checking an additional condition CON #4 of an ignition state indicator of the vehicle indicating an ignition state being "OFF" is carried out. The condition CON #4 of the vehicle ignition state indicator is transferred to the signal evaluation unit 14 via the communication interface 18, which in this specific embodiment is formed by a Local Interconnect Network (LIN) connection. Alternatively, a CAN (Controller Area Network) bus link could be employed.

In another step 58 then, the signal evaluation unit 14 will generate an output signal that is indicative of the seat heater member 32 to be defective on the basis of the fulfillment of the condition representing that the sensed capacitance of the seat heater member 32 is less than the second predetermined threshold value $C_{min}$, and the fulfillment of the condition CON #4 that the ignition state is "OFF", which confirms the condition of the vehicle seat 22 being unoccupied.

If one of the two conditions is not fulfilled, the method steps are automatically repeated.

In this way, the condition that the sensed capacitance of the seat heater member 32 is less than the second predetermined threshold value $C_{min}$, the condition CON #4 that the ignition state indicator of the vehicle indicating an ignition state is "OFF" and the condition CON #7 of an elapsed predetermined time period are combined in a logical conjunction. As will be appreciated by those skilled in the art, other conditions may optionally be combined in the same logical "AND" operation to further increase the reliability of the condition of the vehicle seat 22 being unoccupied.

Figure 3:
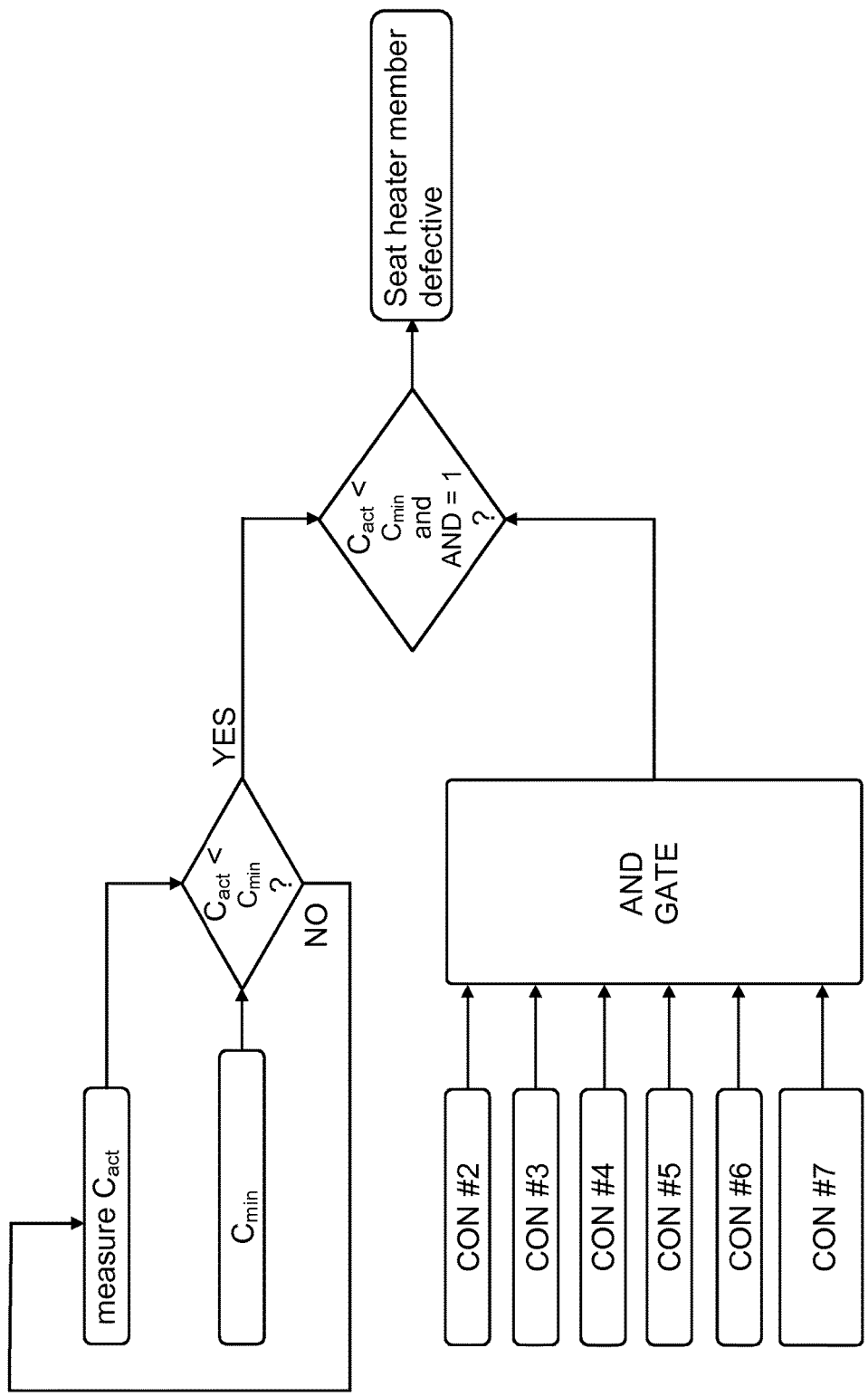
FIG. 3 illustrates the logical configuration of the method pursuant to FIG. 2.

Examples for these conditions are given in FIG. 3, which illustrates the logical configuration of the method. Therein, the following denotation holds:
CON #2 buckle state indicator indicates "UNBUCKLED"
CON #3 vehicle speed indicator indicates "zero"
CON #4 ignition state indicator indicates "OFF"
CON #5 keyless entry state indicator indicates "KEY ABSENT"
CON #6 central locking state indicator indicates "LOCKED"
CON #7 predetermined time period elapsed While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

The invention claimed is:

1. A combined seat heater and capacitive seat occupancy detection system for detecting an occupancy of a vehicle seat, wherein the seat heater comprises at least one seat heater member, and the capacitive detection system includes
    a signal generating unit provided for generating a time-varying output signal at an output port, wherein the time-varying output port is configured to be electrically connectable to the at least one seat heater member for providing the time-varying output signal, and
    a signal evaluation unit that is provided for sensing an electrical quantity that is indicative of a capacitance of the at least one seat heater member, and that is provided for generating an output signal that is representative of the sensed capacitance and that is usable as a basis for at least one out of detecting and classifying a seat occupancy by comparison to at least a first predetermined value ($C_{thresh}$) for a sensed capacitance,
    wherein the signal evaluation unit is configured to generate an output signal that is indicative of the at least one seat heater member being defective, when the sensed capacitance of the at least one seat heater member is less than a second predetermined threshold value ($C_{min}$) for the sensed capacitance.

2. The capacitive vehicle seat occupancy detection system as claimed in claim 1, wherein the second predetermined threshold value ($C_{min}$) is less than a capacitance of the at least one seat heater member for a condition of an unoccupied vehicle seat.

3. A vehicle seat with a capacitive vehicle seat occupancy detection system as claimed in claim 1, wherein the capacitive vehicle seat occupancy detection system is at least partially installed in the vehicle seat, the vehicle seat comprising
    a seat base configured for taking up a seat base cushion, the seat base and the seat base cushion being provided for supporting a bottom of a seat occupant,
    a backrest configured for taking up a backrest cushion provided for supporting a lumbar and back region of the seat occupant, and
    at least one seat heater member,
    wherein the least one seat heater member is at least partially disposed at at least one out of the seat base cushion and the backrest cushion and is electrically connected to the signal generating unit of the capacitive vehicle seat occupancy detection system.

4. A method for detecting a defective seat heater member of a vehicle seat having a capacitive vehicle seat occupancy detection system that is configured for detecting an occupancy of the vehicle seat, the vehicle seat comprising at least one seat heater member, wherein the capacitive vehicle seat occupancy detection system includes a signal generating unit provided for generating a time-varying output signal and a signal evaluation unit that is provided for sensing an electrical quantity that is indicative of a capacitance, the method comprising steps of
    applying a time-varying electrical signal at least to the at least one seat heater member by the signal generating unit,
    sensing an electrical quantity that is indicative of a capacitance of the at least one seat heater member by the signal evaluation unit,
    checking a first condition representing that the sensed capacitance of the at least one seat heater member is less than a second predetermined threshold value ($C_{min}$), and generating an output signal that is indicative of the at least one seat heater member when at least the first condition is fulfilled.

5. The method as claimed in claim 4, comprising the step of using a capacitance value of the at least one seat heater member for a condition of the vehicle seat being unoccupied as the second predetermined threshold value ($C_{min}$).

6. The method as claimed in claim 4, comprising a preceding step of determining the capacitance value of the at least one seat heater member for the condition of the unoccupied vehicle seat for calibration purposes.

7. The method as claimed in claim 4, wherein the vehicle includes a seat buckle state indicator, and the method comprises a step of checking a second condition of the seat buckle state indicator indicating an unbuckled state, and the step of generating an output signal that is indicative of the at least one seat heater member being defective is carried out when the second condition is fulfilled.

8. The method as claimed in claim 4, wherein the vehicle includes a vehicle speed indicator, and the method comprises a step of checking a third condition of the vehicle speed indicator indicating a vehicle speed of zero, and the step of generating an output signal that is indicative of the at least one seat heater member being defective is carried out when at least one out of the second condition and the third condition is fulfilled.

9. The method as claimed in claim 4, wherein the vehicle includes an ignition state indicator, and the method comprises a step (52) of checking a fourth condition of the ignition state indicator indicating an ignition state being off, and the step of generating an output signal that is indicative of the at least one seat heater member being defective is carried out when at least one out of the second condition, the third condition and the fourth condition is fulfilled.

10. The method as claimed in claim 4, wherein the vehicle includes a keyless entry state indicator, and the method comprises a step of checking a fifth condition of the keyless entry state indicator indicating a keyless entry state being an absent key, and the step of generating an output signal that is indicative of the at least one seat heater member being defective is carried out when at least one out of the second condition, the third condition, the fourth condition and the fifth condition is fulfilled.

11. The method as claimed in claim 4, wherein the vehicle includes a central locking state indicator, and the method comprises a step of checking a sixth condition of the central locking state indicator indicating a central locking state being a locked state, and the step of generating an output signal that is indicative of the at least one seat heater member being defective is carried out when at least one out of the second condition, the third condition, the fourth condition, the fifth condition and the sixth condition is fulfilled.

12. The method as claimed in claim 4, wherein the method comprises
   a step of starting a predetermined time period if one out of the first condition, the second condition, the third condition, the fourth condition, the fifth condition and the sixth condition are fulfilled, and
   a step of checking a seventh condition of the predetermined time period having elapsed, and
   the step of generating an output signal that is indicative of the at least one seat heater member being defective is carried out when the seventh condition and at least one out of the second condition, the third condition, the fourth condition, the fifth condition and the sixth condition are fulfilled.

13. A non-transitory digital memory unit comprising a software module having program code that is stored in the digital data memory unit and that is executable by a processor unit of the capacitive vehicle seat occupancy detection system or a separate control unit to carry out the method of claim 4.

* * * * *